United States Patent
Vinslava et al.

(10) Patent No.: US 10,297,675 B1
(45) Date of Patent: May 21, 2019

(54) DUAL-CURVATURE CAVITY FOR EPITAXIAL SEMICONDUCTOR GROWTH

(71) Applicant: GLOBALFOUNDRIES Inc., Grand Cayman (KY)

(72) Inventors: Alina Vinslava, Ballston Lake, NY (US); Hsien-Ching Lo, Clifton Park, NY (US); Yongjun Shi, Clifton Park, NY (US); Jianwei Peng, Latham, NY (US); Jianghu Yan, Singapore (SG); Yi Qi, Niskayuna, NY (US)

(73) Assignee: GLOBALFOUNDRIES Inc., Grand Canyon (KY)

( * ) Notice: Subject to any disclaimer, the term of this patent is extended or adjusted under 35 U.S.C. 154(b) by 0 days.

(21) Appl. No.: 15/795,879

(22) Filed: Oct. 27, 2017

(51) Int. Cl.
| | |
|---|---|
| H01L 21/84 | (2006.01) |
| H01L 21/02 | (2006.01) |
| H01L 29/66 | (2006.01) |
| H01L 21/3065 | (2006.01) |
| H01L 29/78 | (2006.01) |
| H01L 29/161 | (2006.01) |
| H01L 29/16 | (2006.01) |
| H01L 29/165 | (2006.01) |
| H01L 29/08 | (2006.01) |

(52) U.S. Cl.
CPC .. *H01L 29/66636* (2013.01); *H01L 21/02529* (2013.01); *H01L 21/02532* (2013.01); *H01L 21/3065* (2013.01); *H01L 21/845* (2013.01); *H01L 29/0847* (2013.01); *H01L 29/161* (2013.01); *H01L 29/165* (2013.01); *H01L 29/1608* (2013.01); *H01L 29/66795* (2013.01); *H01L 29/7848* (2013.01); *H01L 29/7851* (2013.01)

(58) Field of Classification Search
CPC ............ H01L 21/845; H01L 21/02529; H01L 21/02532; H01L 21/3065; H01L 27/0886; H01L 27/0924; H01L 29/66795
See application file for complete search history.

(56) References Cited

U.S. PATENT DOCUMENTS

| | | | |
|---|---|---|---|
| 6,881,635 B1 | 4/2005 | Chidambarrao et al. | |
| 7,335,959 B2 * | 2/2008 | Curello | H01L 29/6653 257/336 |
| 8,138,053 B2 | 3/2012 | Utomo et al. | |
| 8,410,539 B2 | 4/2013 | Mazoyer et al. | |
| 8,796,759 B2 | 8/2014 | Perng et al. | |
| 8,803,206 B1 | 8/2014 | Or-Bach et al. | |

(Continued)

OTHER PUBLICATIONS

USPTO, Office Action issued in U.S. Appl. No. 15/653,594 dated Jan. 2, 2018.

(Continued)

*Primary Examiner* — Phat X Cao
(74) *Attorney, Agent, or Firm* — Thompson Hine LLP; Francois Pagette

(57) ABSTRACT

Methods of forming a field-effect transistor and structures for a field-effect transistor. A gate structure is formed that overlaps with a channel region in a semiconductor fin. The semiconductor fin is etched with a first etching process to form a first cavity extending into the semiconductor fin adjacent to the channel region. The semiconductor fin is etched with a second etching process to form a second cavity that is volumetrically smaller than the first cavity and that adjoins the first cavity.

13 Claims, 4 Drawing Sheets

(56) References Cited

U.S. PATENT DOCUMENTS

| | | |
|---|---|---|
| 9,640,531 B1 | 5/2017 | Or-Bach et al. |
| 2009/0315092 A1 | 12/2009 | Mikasa |
| 2011/0147842 A1* | 6/2011 | Cappellani ........ H01L 21/26506 257/365 |
| 2012/0205716 A1 | 8/2012 | Adam et al. |
| 2012/0319166 A1 | 12/2012 | Adam et al. |
| 2015/0137193 A1 | 5/2015 | Cheng et al. |
| 2015/0228735 A1 | 8/2015 | Zhong et al. |
| 2017/0110579 A1* | 4/2017 | Chang ................ H01L 29/1083 |
| 2017/0213821 A1 | 7/2017 | Or-Bach et al. |
| 2017/0250278 A1 | 8/2017 | Tsai et al. |
| 2017/0365690 A1 | 12/2017 | Zhao |

OTHER PUBLICATIONS

USPTO, Final Office Action issued in U.S. Appl. No. 15/653,594 dated Jul. 27, 2018.

USPTO, Office Action issued in U.S. Appl. No. 15/795,833 dated Sep. 24, 2018.

* cited by examiner

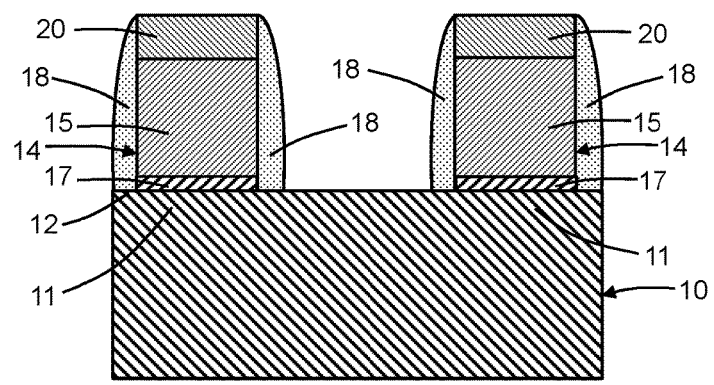
FIG. 1
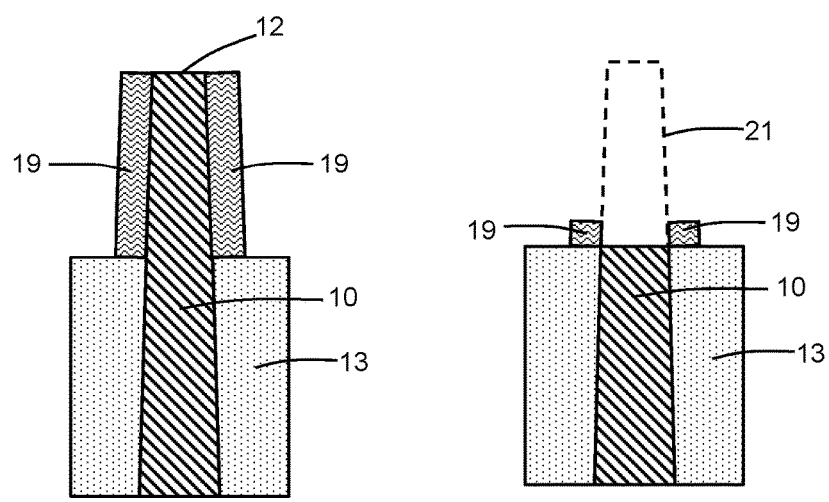
FIG. 1A
FIG. 2A

US 10,297,675 B1

DUAL-CURVATURE CAVITY FOR EPITAXIAL SEMICONDUCTOR GROWTH

BACKGROUND

The present invention relates to semiconductor device fabrication and integrated circuits and, more specifically, to structures for a field-effect transistor and methods of forming a field-effect transistor.

Device structures for a field-effect transistor generally include a body region, a source and a drain defined in the body region, and a gate structure configured to apply a control voltage that switches carrier flow in a channel formed in the body region. When a control voltage that is greater than a designated threshold voltage is applied, carrier flow occurs in the channel between the source and drain to produce a device output current.

Epitaxial semiconductor films may be used to modify the performance of field-effect transistors. For example, an epitaxial semiconductor film can be used to increase the carrier mobility by inducing stresses in the channel. In a p-channel field-effect transistor, hole mobility can be enhanced by applying a compressive stress to the channel. The compressive stress may be applied by forming an epitaxial semiconductor material, such as silicon-germanium, at the opposite sides of the channel. Similarly, in an n-channel field-effect transistor, electron mobility can be enhanced by applying a tensile stress to the channel. The tensile stress may be applied by forming an epitaxial semiconductor material, such as silicon doped with carbon, at the opposite sides of the channel. These stressors may also operate as portions of source and drain regions of the field-effect transistor, and may function as a dopant supply for other portions of the source and drain regions.

The volume of the epitaxial semiconductor material contained in the stressors may be directly linked to device performance and yield. The stress imparted to the channel increases with increasing volume, which optimizes mobility. Increasing the volume may also reduce the source and drain resistance, and may also provide a consistent contact landing area in certain situations.

Accordingly, improved structures for a field-effect transistor and methods of forming a field-effect transistor are needed.

SUMMARY

In an embodiment of the invention, a method is provided for forming a field-effect transistor. A gate structure is formed that overlaps with a channel region in a semiconductor fin. The semiconductor fin is etched with a first etching process to form a first cavity extending into the semiconductor fin adjacent to the channel region. The semiconductor fin is etched with a second etching process to form a second cavity that is volumetrically smaller than the first cavity and that adjoins the first cavity.

In an embodiment of the invention, a structure is provided for forming a field-effect transistor. The structure includes a semiconductor fin with a channel region, a first cavity, and a second cavity that is volumetrically smaller than the first cavity and that adjoins the first cavity. The structure further includes a gate structure that overlaps with the channel region adjacent to the first cavity, and a source/drain region with a first section in the first cavity and a second section in the second cavity.

BRIEF DESCRIPTION OF THE DRAWINGS

The accompanying drawings, which are incorporated in and constitute a part of this specification, illustrate various embodiments of the invention and, together with a general description given above and the detailed description given below, serve to explain the embodiments of the invention.

FIG. 1 is a cross-sectional view of a structure for a field-effect transistor at an initial fabrication stage of a processing method in accordance with embodiments of the invention.

FIG. 1A is a cross-sectional view of the structure of FIG. 1 from a perspective parallel to the length of the semiconductor fin and at a location between the gate structures.

FIG. 2A is a cross-sectional view of the structure of FIG. 2 from a perspective parallel to the length of the semiconductor fin and at a location between the gate structures.

DETAILED DESCRIPTION

Figure 2:
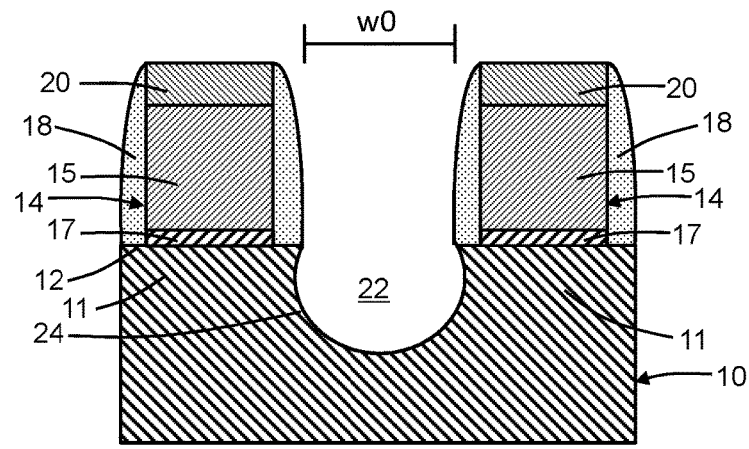
FIG. 2 is a cross-sectional view of the structure of FIG. 1 at a subsequent fabrication stage of the processing method.

With reference to FIGS. 1, 1A and in accordance with embodiments of the invention, gate structures 14 are arranged on a top surface 12 of a semiconductor fin 10 and overlap with respective channel regions 11 in the semiconductor fin 10 at spaced apart locations. The gate structures 14 may also be located on trench isolation 13 adjacent to the semiconductor fin 10. The semiconductor fin 10 is composed of a single crystal semiconductor material and, in an embodiment, the semiconductor fin 10 may be composed of single-crystal silicon. The semiconductor fin 10 may be formed by patterning a substrate or an epitaxial layer grown on a substrate using a sidewall imaging transfer (SIT) process, self-aligned double patterning (SADP), or self-aligned quadruple patterning (SAQP).

Each gate structure 14 includes a gate electrode 15 and a gate dielectric 17 interposed between the gate electrode 15 and the semiconductor fin 10. The gate electrode 15 may be composed of polycrystalline silicon (i.e., polysilicon), or may include one or more barrier metal layers, work function metal layers, and/or fill metal layers composed of conductors, such as metals (e.g., tungsten (W)) and/or metal nitrides or carbides (e.g., titanium nitride (TiN) and titanium aluminum carbide (TiAlC)). The gate dielectric 17 may be composed of a dielectric material, such as silicon dioxide ($SiO_2$) or a high-k dielectric material like hafnium oxide ($HfO_2$). The gate structures 14 may be functional gate structures or, in the alternative, may be sacrificial gate structures that are subsequently removed and replaced by functional gate structures in a replacement metal gate process. The term "sacrificial gate structure" as used herein refers to a placeholder structure for a functional gate structure to be subsequently formed. The term "functional gate structure" as used herein refers to a permanent gate structure used to control output current (i.e., flow of carriers in the channel) of a field-effect transistor.

Sidewall spacers 18 are positioned on the top surface 12 of the semiconductor fin 10 at locations adjacent to the vertical sidewalls of each gate structure 14. The sidewall spacers 18 may be composed of a dielectric material, such as silicon nitride ($Si_3N_4$), deposited as a conformal layer by atomic layer deposition (ALD) and etched with a directional etching process, such as reactive ion etching (RIE). The conformal layer used to form the sidewall spacers 18 may be a protect layer that is applied over the semiconductor fin 10 and gate structures 14 while processing field-effect transistors of the complementary type.

Sidewall spacers 19 are also positioned on the sidewalls of the semiconductor fin 10. The sidewall spacers 19 may be composed of a dielectric material, such as silicon nitride ($Si_3N_4$), deposited as a conformal layer by ALD and etched with a directional etching process, such as reactive ion etching (RIE). In an embodiment, the sidewall spacers 18 and the sidewall spacers 19 may be concurrently formed.

The gate structures 14 and sidewall spacers 18 cover respective areas on the top and side surfaces of the semiconductor fin 10. The gate structures 14 may also be arranged to overlap with shallow trench isolation (not shown) surrounding the semiconductor fin 10. An area between the gate structures 14 and their sidewall spacers 18 on the top surface 12 and the side surfaces of the semiconductor fin 10 is exposed.

A cap 20 is arranged on the top surface of the gate electrode 15 of each gate structure 14 and in a space arranged laterally between the sidewall spacers 18. The caps 20 may be composed of a dielectric material, such as silicon nitride ($Si_3N_4$), deposited by chemical vapor deposition (CVD).

With reference to FIGS. 2, 2A in which like reference numerals refer to like features in FIGS. 1, 1A and at a subsequent fabrication stage of the processing method, a section of the semiconductor fin 10 arranged between the gate structures 14 is removed over the exposed area to form a trench or cavity 22 that penetrates in a vertical direction to a given depth into the semiconductor fin 10. Additional sections of the semiconductor fin 10 may be removed between the sidewall spacers 18 to form a fin cavity 21, as diagrammatically shown by the dashed lines in FIG. 2A. The cavities 21, 22 may be formed using an isotropic etching process with a suitable etch chemistry. The etching processes forming the cavities 21, 22 may concurrently and partially remove the sidewall spacers 19 from the semiconductor fin 10, as best shown in FIG. 2A.

The cavity 22 has a sidewall 24 with a given curvature that imparts a ball shape to the cavity 22. The entrance to the cavity 22 at the top surface 12 of the semiconductor fin 10 may have a width dimension, w0, equal to the distance between the sidewall spacers 18. The sidewall 24 curves outwardly beneath the sidewall spacers 18 to a width dimension slightly larger than the width dimension, w0, due to undercutting during the anisotropic etching process. The cavity 22 therefore undercuts the sidewall spacers 18.

Figure 3:
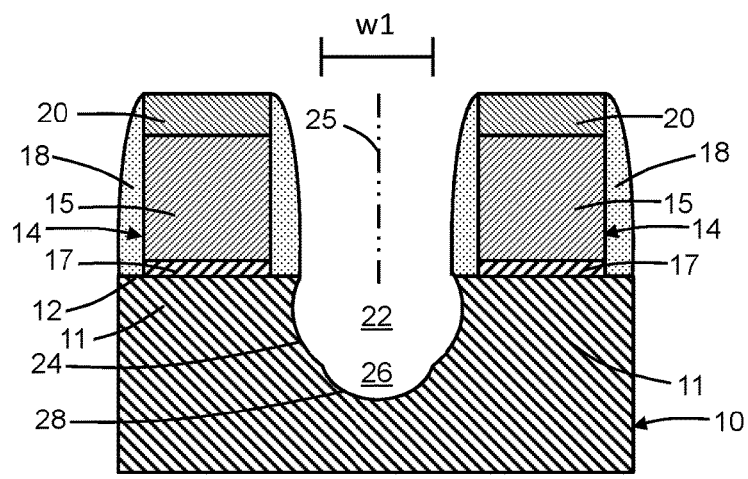
FIG. 3 is a cross-sectional view of the structure of FIG. 2 at a subsequent fabrication stage of the processing method.
Figure 3A:
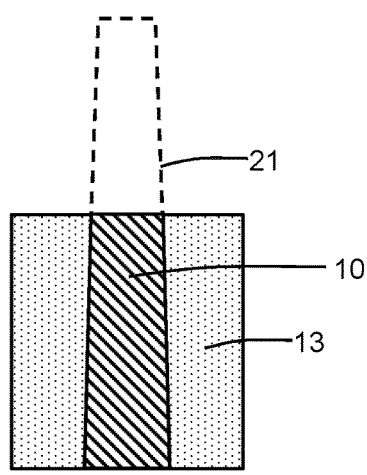
FIG. 3A is a cross-sectional view of the structure of FIG. 3 from a perspective parallel to the length of the semiconductor fin and at a location between the gate structures.

With reference to FIGS. 3, 3A in which like reference numerals refer to like features in FIGS. 2, 2A and at a subsequent fabrication stage of the processing method, a trench or cavity 26 is formed that is superimposed on the cavity 22. The cavity 26 may be formed using a reactive ion etching (RIE) process with a suitable etch chemistry, such as a RIE process using carbon tetrafluoride ($CH_4$) as a source gas to generate the reactive ions. The etching process is a dry anisotropic etch that is directional, and is self-aligned by the sidewall spacers 18 on the gate structures 14. The result is that the width dimension of the cavity 26 is related to, and typically slightly less than, the distance between the sidewall spacers 18.

The cavity 26 is volumetrically smaller than the cavity 22, and the cavity 26 defines a tip that effectively deepens the central section of the cavity 22. Due to the anisotropy of the etch and the self-alignment, the portions of the sidewall 24 of the cavity 22 beneath the sidewall spacers 18 retain the original curvature and are not modified when the cavity 26 is formed. In addition, the self-alignment during the anisotropic etching process and the isotropy of the isotropic etching process result in the cavity 26 being symmetrical about, and centered relative to, the cavity 22 about a plane 25.

The cavity 26 has a sidewall 28 with a curvature that differs from the curvature of the sidewall 24 of cavity 22. In particular, the curvature of the sidewall 28 is less than the curvature of the sidewall 24. The cavity 26 is shaped as a partial circle in cross-section having a given arc length related to its radius of curvature.

The etching processes forming the cavity 26 may concurrently remove the remainder of the sidewall spacers 19 from the semiconductor fin 10, as best shown in FIG. 3A. The composite shape of the cavities 22, 26 and, in particular, the addition of the cavity 26 promotes the complete removal of the sidewall spacers 19.

Figure 4A:
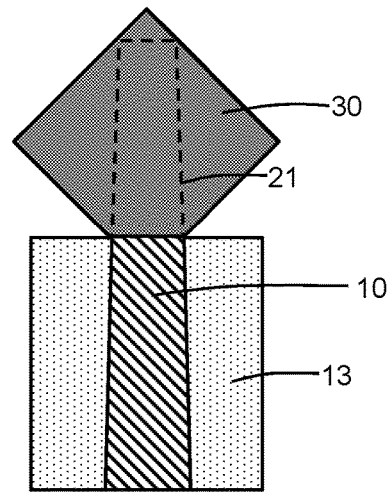
FIG. 4A is a cross-sectional view of the structure of FIG. 4 from a perspective parallel to the length of the semiconductor fin and at a location between the gate structures.
Figure 4:
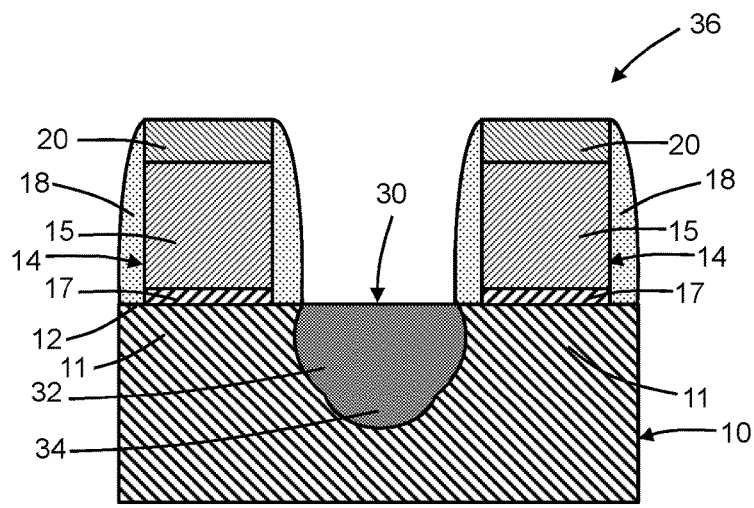
FIG. 4 is a cross-sectional view of the structure of FIG. 3 at a subsequent fabrication stage of the processing method.

With reference to FIGS. 4, 4A in which like reference numerals refer to like features in FIGS. 3, 3A and at a subsequent fabrication stage of the processing method, an embedded source/drain region 30 is formed in the cavities 22, 26 and may complete the formation of a multi-gate fin-type field-effect transistor (FinFET) 36. The embedded source/drain region 30 is comprised of epitaxial semiconductor material that is grown in the cavities 22, 26 and adopts the shape of the cavities 22, 26 inside the fin 10. In particular, the embedded source/drain region 30 includes a section 32 that is located in the cavity 22 in the semiconductor fin 10 and a section 34 that is located in the cavity 26 in the semiconductor fin 10. The section 32 of the embedded source/drain region 30 is arranged between the section 34 of the embedded source/drain region 30 and the top surface 12 of the semiconductor fin 10. Outside of the cavities 22, 26 in the fin 10, the epitaxial semiconductor material of the source/drain region 30 adopts a faceted shape at its exterior surface, as best shown in FIG. 4A.

An epitaxial growth process may be used to deposit the epitaxial semiconductor material, such as silicon germanium (SiGe) or carbon-doped silicon (Si:C), to form the embedded source/drain region 30, and may include in situ doping during growth to impart a given conductivity type to the grown semiconductor material. In an embodiment, the embedded source/drain region 30 may be formed by a selective epitaxial growth process in which semiconductor material nucleates for epitaxial growth on semiconductor surfaces, but does not nucleate for epitaxial growth from insulator surfaces. As used herein, the term "source/drain region" means a doped region of semiconductor material that can function as either a source or a drain of a field-effect transistor. For a p-type field-effect transistor, the semiconductor material of the embedded source/drain region 30 may be doped with a p-type dopant selected from Group III of the Periodic Table (e.g., boron (B)) that provides p-type conductivity. For an n-type field-effect transistor, the semiconductor material of the embedded source/drain region 30 may be doped with an n-type dopant selected from Group V of the Periodic Table (e.g., phosphorus (P) or arsenic (As)) that provides n-type conductivity.

The embedded source/drain region 30 may be strained and incorporate internal stress through control over the conditions and parameters characterizing the epitaxial growth process. The embedded source/drain region 30 may operate as an embedded stressor that transfer stress to the channel regions 11 of the semiconductor fin 10 such that the channel regions 11 are placed under stain, which may increase carrier mobility during device operation. If the embedded source/drain region 30 is composed of Si:C, tensile strain may be produced in the channel regions 11, which may be appropriate for an n-type field-effect transistor. If the embedded source/drain region 30 is composed of SiGe, compressive strain may be produced in the channel regions 11, which may be appropriate for a p-type field-effect transistor.

Figure 5:
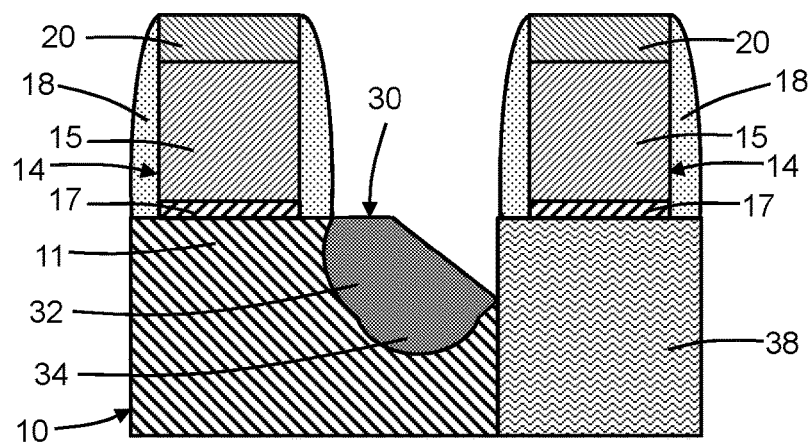
FIG. 5 is a cross-sectional view of a structure implemented in connection with a single diffusion break in accordance with alternative embodiments of the invention.

With reference to FIG. 5 in which like reference numerals refer to like features in FIG. 4 and in accordance with alternative embodiments, the introduction of the additional cavity 26 may be implemented in connection with a single diffusion break (SBD) in which only a single dummy gate is located between active regions, in contrast to the embodiments of FIGS. 1-4 illustrating implementation with a double diffusion break (DDB). To that end, a shallow trench isolation region 38 may be formed adjacent to the fin 10. The etching processes forming the cavities 22, 26 etches the semiconductor material of the semiconductor fin 10 selective to the dielectric material of the shallow trench isolation region 38. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. The epitaxial semiconductor material used to form the embedded source/drain region 30 does not nucleate from the dielectric material of the shallow trench isolation region 38, which modifies the shape of the embedded source/drain region 30.

The formation of the cavities 22, 26 with two distinct etching processes decouples the formation of the cavity 26 from the formation of the cavity 22. The introduction of the cavity 26 by the anisotropic etching process increases the volume of the epitaxial semiconductor material contained in the embedded source/drain region 30. The increased volume of the source/drain region 30 from the addition of the section 34 may be linked to device performance of the FinFET 36 by sufficient surface area for effective implants as well as consistent contact landing in a SDB area. The increased volume of the source/drain region 30 from the addition of the section 34 may increase the stress transferred to the channel of the FinFET 36, which may further increase carrier mobility, and may reduce the electrical resistance of the source/drain region 30, each of which may boost device performance.

The etching processes forming the cavities 22, 26 inside the fin 10 concurrently pull down the sidewall spacers 19. Complete removal of the sidewall spacers 19, which is promoted by the additional cavity 26, optimizes the volume of semiconductor material in the source/drain region 30 by increasing the surface area of the growth seed provided by the fin 10. Merely increasing the volume of cavity 22 would also increase the cavity depth, but degrades the faceting of the epitaxial semiconductor material, particularly in a SDB area, leading to increased leakage and a reduced yield due to difficulties in contacting the source/drain region 30. The addition of the cavity 26 is achieved without changing the profile or shape of the cavity 22, which ensures that the faceting of the epitaxial semiconductor material is not degraded while also increasing the volume of the epitaxial semiconductor material. The height of the intercept between the source/drain region 30 and the shallow trench isolation region 38 is also increased so that the facet plane is elevated.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for forming a field-effect transistor, the method comprising:

forming a gate structure that overlaps with a channel region in a semiconductor fin;

forming a sidewall spacer on the semiconductor fin adjacent to the channel region;

etching the semiconductor fin with a first etching process to form a first cavity extending into the semiconductor fin adjacent to the gate structure;

removing a first portion of the sidewall spacer from the semiconductor fin with the first etching process to leave a second portion that is not removed;

etching the semiconductor fin with a second etching process to form a second cavity that is volumetrically smaller than the first cavity and that adjoins the first cavity; and removing the second portion of the sidewall spacer from the semiconductor fin with the second etching process.

2. The method of claim 1 wherein the first cavity is formed before forming the second cavity.

3. The method of claim 1 wherein the semiconductor fin is composed of silicon, and the second etching process is an anisotropic etching process.

4. The method of claim 3 wherein the first etching process is an isotropic etching process.

5. The method of claim 1 wherein the first cavity extends from a top surface of the semiconductor fin to a first depth, and the first cavity is arranged between the second cavity and the top surface of the semiconductor fin.

6. The method of claim 5 wherein the second cavity is centered relative to the first cavity.

7. The method of claim 1 further comprising:
epitaxially growing an embedded source/drain region having a first section in the first cavity and a second section in the second cavity.

8. The method of claim 7 wherein the semiconductor fin is composed of silicon, and the embedded source/drain region includes internal stress that is transferred to the channel region in the semiconductor fin.

9. The method of claim 8 wherein the embedded source/drain region is composed of silicon-germanium, the field-effect transistor is a p-type field-effect transistor, and the embedded source/drain region transfers compressive strain to the channel region.

10. The method of claim 8 wherein the embedded source/drain region is composed of carbon-doped silicon, the field-effect transistor is an n-type field-effect transistor, and the embedded source/drain region transfers tensile strain to the channel region.

11. The method of claim 1 wherein the gate structure includes a gate electrode, and further comprising:
forming a sidewall spacer on the gate electrode,
wherein the first cavity undercuts the sidewall spacer on the gate electrode.

12. The method of claim 11 wherein the second etching process is self-aligned by the sidewall spacer on the gate electrode, and the second etching process is anisotropic.

13. The method of claim 1 wherein the first cavity has a curved sidewall, the second cavity has a curved sidewall with a smaller radius of curvature than the curved sidewall of the first cavity, and the curved sidewall of the second cavity intersects the curved sidewall of the first cavity.

\* \* \* \* \*